United States Patent [19]

Letcher, III

[11] Patent Number: 4,893,082

[45] Date of Patent: Jan. 9, 1990

[54] NOISE SUPPRESSION IN MAGNETIC RESONANCE IMAGING

[76] Inventor: John H. Letcher, III, 7421 S. Marion, Tulsa, Okla. 74136

[21] Appl. No.: 309,804

[22] Filed: Feb. 13, 1989

[51] Int. Cl.$^4$ .................................... G01R 33/20
[52] U.S. Cl. ............................ 324/312; 324/77 B
[58] Field of Search ............... 324/77 R, 77 B, 77 D; 324/57 N, 300, 307, 309, 310, 311, 312, 313, 314, 318, 322; 381/94; 364/827, 724.11; 360/45; 332/16 R; 455/63, 226; 328/167

[56] References Cited

U.S. PATENT DOCUMENTS

| | | | |
|---|---|---|---|
| 3,984,669 | 10/1976 | Lehmann | 324/77 D |
| 4,006,351 | 2/1977 | Constant | 364/724.11 |
| 4,100,604 | 7/1978 | Perreault | 364/827 |
| 4,106,103 | 8/1978 | Perreault | 364/827 |
| 4,344,093 | 8/1982 | Huber | 360/45 |
| 4,438,413 | 3/1984 | Ryan | 332/16 R |
| 4,500,984 | 2/1985 | Shimbo | 455/63 |
| 4,597,107 | 6/1986 | Ready | 455/226 |
| 4,634,988 | 1/1987 | Romeo | 328/167 |
| 4,658,426 | 4/1987 | Chabries | 381/94 |
| 4,686,457 | 8/1987 | Banno | 324/77 B |

Primary Examiner—Michael J. Tokar

[57] ABSTRACT

A method and associated system are disclosed for suppressing the undesirable effect of noise found in signals, such as from a magnetic resonance miager's (MRI) receiving antenna. The method convolves a sampled real and secondary signal taken from a signal detector with a transfer function, which is expressed in terms of the power spectrum of the measured signal with noise and measured power spectrum of the noise.

12 Claims, 1 Drawing Sheet

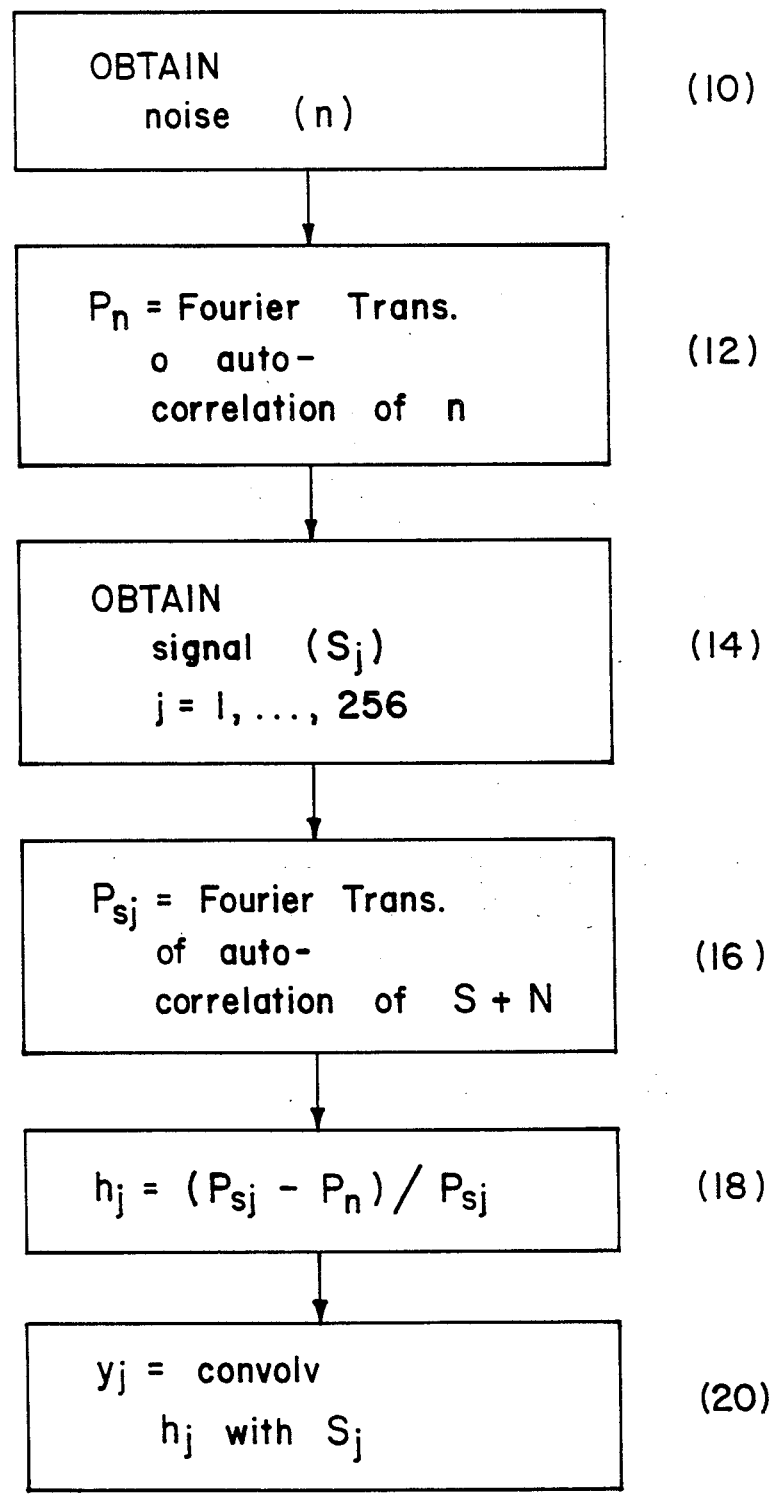

NOISE SUPPRESSION IN MAGNETIC RESONANCE IMAGING

BACKGROUND OF THE INVENTION

1. Field of the Invention

The present invention relates to signal processing to remove or suppress undesired noise and, more particularly, to improving the quality of nuclear magnetic images.

2. Description of the Prior Art

Magnetic resonance imaging (MRI) has been gaining wider acceptance as a medical diagnostic tool to non-invasively prepare density maps of living tissue. The operation of magnetic resonance imaging is well known as indicated by the following two articles: "NMR Imaging In Medicine", Pykett, *Scientific American* 246/768 (May 1982), and "Nuclear Magnetic Resonance Imaging" Smith. *Analytical Chemistry* 57/595A (1985).

Within MRI equipment, a receiving antenna detects signals emitted from the patient and which are received as a sequence of complex time series from which images are produced. Unfortunately, the quality of the images can be greatly reduced by the reception and incorporation of noise generated in or about the receiving antenna. Such noise can be static or power surging in the electrical supply, strong local RF sources, such as radio/television transmitters and other adjacent, powerful medical equipment, or noise generated within the MRI itself. The reduction in image quality is evidenced by shadows, haze and/or bands of horizontal lines. Such reduction in image quality can present a problem to a medical practioner trying to correctly detect abnormal tissue within a patient.

To ensure that such noise is reduced or eliminated, the MRI is equipped with shielded/filtered power supply and a plurality of RF shields. Further, very careful attention is paid to proper manufacturing of components and proper maintenance. Due to continued use and the inherent complexity of the MRI, the undesirable effects of such received noise often becomes apparent. Usually, the MRI is then shut down until a repair person can adjust the RF shields, etc. to try to correct the problem. However, ceasing the use of the MRI is wasteful, and even the most skilled technician cannot remove noise caused by the MRI's internal components.

There is a need for a simple system that can be used on existing machines, as well as incorporated into the manufacture of an MRI to suppress or eliminate the undesirable effects of noise.

SUMMARY OF THE INVENTION

The present invention has been developed to overcome the foregoing deficiencies and meet the above described need. The present invention is a method and associated system whereby a received signal (s), that contains noise (n) and the desired actual signal (g), is processed to suppress the noise (n) using signal processing transformation techniques. A sample of the noise (n) is taken and the power spectrum of the noise (n), found using a Fourier Transform of an auto-correlation of the noise (n), yields $P_n$. A data set of the signal (s) is obtained and the power spectrum of the signal (s), found by using a Fourier Transform of an auto-correlation of the signal (s), yields $P_s$. A transfer function $(P_s - P_n)/P_s$ yields h, which is then convolved with (s) to yield a new signal (y) which is approximately equal to the actual signal (g). The result of using this method is the elimination of or at least great reduction of the shadows, haze and horizontal lines caused by the incorporated noise.

BRIEF DESCRIPTION OF THE DRAWING

The drawing is a flow chart illustrating the steps of one method of suppressing the effects of noise in an MRI in accordance with one embodiment of the present invention.

DETAILED DESCRIPTION OF THE PREFERRED EMBODIMENTS

Prior to describing the novel features of the present invention, the following background discussion of signal processing within an MRI is provided. By applying a properly designed RF pulse to a tissue or other sample, one can induce conditions such that the observed signal from a small sample volume in a magnetic field H, $$dS = dx\,dy\,dz\,N(x,y,z)\exp(-2\pi i f t + \phi) \quad (1)$$

where N is proportional to the number of molecular spins within this infinitesimal volume. The frequency, f, of the emitted radiation is directly proportional to the imposed magnetic field strength, H. Therefore, by superimposing on the steady magnetic field and gradients in two of the orthogonal directions it is possible to (1) select for excitation only spins within one plane and (2) cause a distribution in emitted frequencies in a plane perpendicular to the selected plane. A sequence of RF pulses and imposed gradients are used so that the signal can be sampled which produces a time series of a complex signal. One then generates a sequence of these times series, one different from the other by a varying of a gradient in the third orthogonal direction. This generates a pseudo-time frequency so that looking at the set of time series $(t_1, t_2)$ as a whole the received signal is expressed as:

$$g(t_1, t_2) = \int_{-\infty}^{\infty} \int_{-\infty}^{\infty} G(f, \phi) e^{-2\pi i (f t_1 + \phi t_2)} df\,d\phi \quad (2)$$

The gradients are selected so that $f = f_0 + x$ and $\phi = f_0 + y$ where f is the Larmor frequency, at which resonance is produced by $H_0$.

The sampled data in the MRI are measurements of $g(t_1, t_2)$. For example, in a 256 by 256 image, 256 sequences of 256 equally spaced sampled points of a complex signal are measured by two channel analog-to-digital conversions. By two dimensional Fourier Transformation, the spin density function G(x,y) is given by:

$$G(x, y) = \int_{-\infty}^{\infty} \int_{-\infty}^{\infty} g(t_1, t_2) e^{2\pi i (x t_1 + y t_2)} dt_1\,dt_2 \quad (3)$$

Since the signal is sampled N times, the continuous function $g(t_1, t_2)$ is recorded as a complex array $g(pT_x, qT_y)$ where p and q are integers in the interval [0,255] and $T_x$ and $T_y$ are constants for a given experiment.

Using $T_x = T_y = 4 \times 10^{-5}$ seconds for the examples below and N=256, if n and m are integers in the interval [0,255] then:

$$G(n/NT_x, m/NT_y) = \sum_{q=0}^{N-1} \sum_{p=0}^{N-1} g(pT_x, qT_y) \, e^{2\pi i \, np/N} \, e^{2\pi j \, mg/N} \quad (4)$$

Please notice that G and g are complex but are easily stored in an associated programmable digital computer as complex arrays G(n,m) and g(p,q). The magnitude image I(n,m) is a real array calculated as follows:

$$I(n,m) := (|\text{Real}(G(n,m))|^2 |\text{Imag}(G(n,m))|^2)^{\frac{1}{2}}$$

By the form of Eqn(2) and by the use of properties of the received time series (eg. each of these is a wavelet) one may then apply two dimensional Fourier Transformation to obtain the two dimensional array of complex image data—the magnitude of which is the "image". Image reconstruction algorithms are derived by the forms of the equations and the properties of the functions, not by applying any physical laws. Theoretically, this procedure can be carried out to produce images of tissue or other samples of extraordinary quality. There appears to be no theoretical limitation to the accuracy of this method. Unfortunately, additive noise is present in the received signal. Therefore, the two dimensional Fourier Transformation is performed on the signal plus noise which produces a variety of artifacts, such as ghosts, haze or lines observed in the images.

In order to remove or at least suppress the effects of this additive noise, the present invention can be utilized in several different embodiments as described below. In the signal receiving process of an MRI, the desired actual signal $g(t_1,t_2)$ is mixed with ambient noise $n(t_1,t_2)$ so that the received signal that is then processed and imaged is actually $s(t_1,t_2) = g(t_1,t_2) + n(t_1,t_2)$, where g and n are assumed to be ergodic random variables, and $t_1$ and $t_2$ are separate time elements. The present invention uses a "digital filter" so that the signal (s) is transformed into a signal (g), which, in the least squares sense, is as close to (g) as possible.

Referring to the drawing, the first step (10) of the method is to obtain a data set over time $n(t_1,t_2)$ of the ambient noise received at the antenna. This procedure is usually done once and the data set stored within memory of an associated programmable digital computer (which can be functionally part of the MRI). However, as will be made clearer later, the measurement of the noise can be taken before each processing sequence per data set so that any noise amplitude increase/decrease or frequency shift will be continually and correctly compensated for. The time required to measure the noise before each processing sequence per data set can easily occur in the dummy cycles prior to the actual signal receipt.

The second step (12) of the method is to obtain a measure of the power spectrum of the noise (n), referred to as $P_n$. The power spectrum ($P_n$) can be obtained in any known manner. For example, the Fourier Transform of the auto-correlation of the noise (n) can be used to derive $P_n$. Auto-correlation as used herein means the correlation (measure of similarity) of a signal with itself; and Fourier Transform as used herein means the conversion of a signal from a time function into a frequency-domain representation and visa versa. Again, various signal processing algorithms for auto-correlation and Fourier Transformation are well known to those skilled in the art.

The third step (14) of the method is to obtain the data set (s=g+n) over the desired time duration. The signal data set includes a time series of X increments, so that $S_j$, j=1, ..., X. In most cases of an MRI X=256, 512 or $2^N$, with N being an integer. The fourth step (16) of the method is to calculate the power spectrum of the received signal ($P_s$), again, using known procedures. For example, the Fourier Transform of the auto-correlation of the signal (s) is calculated over the time series, j=1, ..., X to render ($P_{sj}$). In order to approximate the actual signal (g) without the noise (n), the fifth step (18) is used to calculate a transfer function $h_j = (P_{sj} - P_n)/P_{sj}$ for each data set. Note that the transfer function $h_j$ is different for each data set ($s_j$).

Thereafter, in step (20) each transfer function ($h_j$) is convolved with the signal ($S_j$) to yield a new signal ($y_j$), wherein $y_j$ is approximately equal to $g_j$. The signal $y_j$ is then processed in the usual manner for the desired signal processing application. In the case of an MRI, the signal ($y_j$) is processed to produce the visual image of the tissue density. Since a Fourier Transform is utilized on each $g_j$ as part of the MRI's image reconstruction process, the step (20) is carried out normally by the MRI and does not need to be a separate, added calculation.

Using conventional programming techniques, the time cost of performing the above described method of the present invention is the price of the calculation of an auto-correlation (which is equivalent to an additional Fourier Transform plus a multiplication). Because of the usual lapse in signal activity between RF pulses and the inherent computational efficiency of the method, there will be no apparent effect on the "speed" of the MRI by using the method of the present invention. Therefore, it is recommended that this method be used in the image reconstruction process at all times.

EXAMPLE DESCRIPTION

Equipment was assembled to carry out the signal acquisition, filtering, Fourier Transformation, image display, image manipulation and other tasks to test the present method with a computer which was independent (but working in parallel with) of that included within the MRI.

The MRI gradients and RF signals were generated by a Picker International Vista MRI, and the magnet was an Oxford 0.5 tesla superconducting magnet, which is in current use for medical purposes. The receiving coil was a commercially supplied body coil, head coil or surface coils. The receiving unit included a preamp/filter and quadrature detector to accept the signal from the MRI receiving antenna. A unit was built that included a dual channel 16 bit analog-to-digital conversion processor (an Analogic Corporation Shad 2). This and the control circuit composed two finite engines contained in a small enclosure that was placed next to the quadrature detector of the MRI. A fiber optic cable or ordinary flat cable (depending upon the distance to the receiving computer) sent the real and imaginary 16 bit samples (taken at a rate of 100,000 samples per second) to a specially built circuit card. The circuit card was inserted into an industrial grade I.B.M. PC/AT-type computer (a Diversified Technology CAT 901) where the memory bus, and IO bus were run at 10 megahertz with zero wait states. The image reconstruction and filtering described herein were performed using Intel 80286 and 80287 processors and the Fourier Transformation software was a variant of the Cooley Tukey algorithm. Image display was accomplished using a Matrox professional image processor (PIP 640B)

which fed an Electrohome 15 inch 1000 line resolution 256 level gray scale monitor.

A commercially available MRI Image or "phantom" manufactured by Picker International was used to provide experimental image data. The above described equipment was run and tampered with to induce a variety of different types of noise to test the performance of the noise filtering method of the present invention. For example, in one test a grounding lead from the imaging unit was intentionally broken, thereby inducing additive noise to the imaginary signal, and a coherent essentially single frequency signal was also induced to produce a number of artifacts, such as haze and broad horizontal lines that greatly diminished the interpretibility of the image. Thereafter, the same data with added noise were filtered by the method of the present invention. The results were a significant improvement in the quality of the image by elimination of the haze and horizontal lines without any apparent degradation in the unaffected parts of the image itself.

While the above procedure has been discussed as being used with Magnetic Resonance Imagers (MRI); it should be understood that this noise suppression method can be used on any desired type of signal processing, such as radar, telemetry, seismic signals and the like.

Wherein the present invention has been described in particular relation to the Drawing attached hereto, it should be understood that other and further modifications, apart from those shown or suggested herein, may be made within the scope and spirit of the present invention.

What is claimed is:

1. A method of removing the effects of noise from a received signal ($s = n + g$) containing the noise (n) and an actual signal (g), comprising:
   (a) obtaining at least one sample of ambient noise (n);
   (b) obtaining a power spectrum of the noise ($P_n$);
   (c) obtaining a data set of the signal (s);
   (d) obtaining a power spectrum of the signal ($P_s$);
   (e) obtaining a transfer function $h = (P_s - P_n)/P_s$; and
   (f) obtaining the convolution of h with s yielding signal (y), wherein $y \approx g$.

2. The method of claim 1 wherein step (c) includes obtaining a plurality of data sets of the signal ($s_j$, $j = 1, \ldots X$, wherein $X = 2^N$, with N being an integer).

3. The method of claim 2 wherein $s_j$, $j = 1, \ldots, 256$.

4. The method of claim 1 wherein step (a) is performed prior to each step (c).

5. The method of claim 2 wherein step (e) is performed for each $s_j$, $j = 1, \ldots X$.

6. A method of removing the effects of noise from a received signal ($s = n + g$) containing the noise (n) and an actual signal (g) to improve the image quality from a magnetic resonance imager (MRI), comprising:
   (a) obtaining at least one sample of ambient noise (n);
   (b) obtaining a Fourier Transform of an auto-correlation of the noise (Pn);
   (c) obtaining a data set of the signal (s);
   (d) obtaining a Fourier Transform of an auto-correlation of the signal ($P_s$);
   (e) obtaining a transfer function $h = (P_s - P_n)/P_s$;
   (f) obtaining the convolution of h with s yielding (y), wherein $y \approx g$; and
   (g) processing y to obtain an MRI image.

7. A system for removing the effects of noise from a signal ($s = n + g$) containing the noise (n) and an actual signal (g), comprising:
   (a) means for obtaining at least one sample of ambient noise (n);
   (b) means for obtaining a Fourier Transform of an auto-correlation of the noise ($P_n$);
   (c) means for obtaining a data set of the signal (s);
   (d) means for obtaining a Fourier Transform of an auto-correlation of the signal ($P_s$);
   (e) means for obtaining a transfer function $h = (P_s - P_n)/P_s$; and
   (f) means for obtaining the convolution of h with s yielding (y) wherein $y \approx g$.

8. The system of claim 7 and including means for obtaining a plurality of data sets of the signal ($s_j$, $j = 1, \ldots X$, $X = 2^N$, with N being an integer).

9. The system of claim 8 wherein $s_j$, $j = 1, \ldots, 256$.

10. The system of claim 7 and including means for obtaining a sample of ambient noise (n) prior to obtaining each data set of the signal (s).

11. The system of claim 8 and including means for obtaining the transformation h for each data set ($s_j$, $j = 1, \ldots X$, $X = 2^N$, with N being an integer).

12. A system for removing noise from a signal ($s = n + g$) containing the noise (n) and an actual signal (g) to improve the image quality from a magnetic resonance imager (MRI), comprising:
   (a) means for obtaining at least one sample of ambient noise (n);
   (b) means for obtaining a Fourier Transform of an auto-correlation of the noise ($P_n$);
   (c) means for obtaining a data set of the signal (s);
   (d) means for obtaining a Fourier Transform of an auto-correlation of the signal ($P_s$);
   (e) means for obtaining a transfer function $h = (P_s - P_n)/P_s$;
   (f) means for obtaining the convolution of h with s yielding (y), wherein $y \approx g$; and
   (g) processing g to obtain an MRI image.

* * * * *